Aug. 24, 1965 J. T. MURASZKO 3,202,930

APPARATUS FOR FREQUENCY SYNTHESIS

Filed Dec. 10, 1963 2 Sheets-Sheet 1

United States Patent Office 3,202,930

Patented Aug. 24, 1965

3,202,930

APPARATUS FOR FREQUENCY SYNTHESIS

Jan Tadeusz Muraszko, North Harrow, England, assignor to The Plessey Company Limited, Ilford, England, a British company Filed Dec. 10, 1963, Ser. No. 329,600
3 Claims. (Cl. 331—2)

This invention relates to electrical oscillation generators of the kind sometimes referred to as "frequency synthesisers," in which a user can obtain an output of any desired frequency within a given range by setting a series of controls each corresponding to a digit of the number representing the desired frequency.

According to the invention, an oscillation generator includes an electrical oscillation generator including a plurality of identical stages each consisting of a variable-frequency oscillator, a mixer device and a frequency discriminator device; a source for a series of standard frequencies any one of which can be selected for feeding to the mixer device of any stage; the stages being arranged in a predetermined sequence whereby a first input to the discriminator device of each stage except the first stage is obtained through one of a series of identical frequency dividers from the variable-frequency oscillator of the next preceding stage in the sequence, a second input to the discriminator consisting of the difference frequency resulting from the comparison in the mixer device of the stage of the selected one of the said standard frequencies with the frequency of the variable-frequency oscillator of the stage, which is arranged to be controlled in accordance with an output of the discriminator device in such a way as to reduce to zero the difference in frequency between the said two inputs to the discriminator.

The first input to the discriminator of the first stage can be obtained either from the standard frequency series, through a suitable fixed-ratio divider stage, or from a free-running continuously-variable oscillator, giving stepless control of output frequency.

The foregoing and other features of the invention will be evident from the following description of two preferred forms of oscillation generator embodying the invention. The description refers to the accompanying drawings, in which FIGURE 1 shows a block diagram of one form of oscillation generator and FIGURE 2 shows a detail of a slightly modified form of generator.

Figure 1:
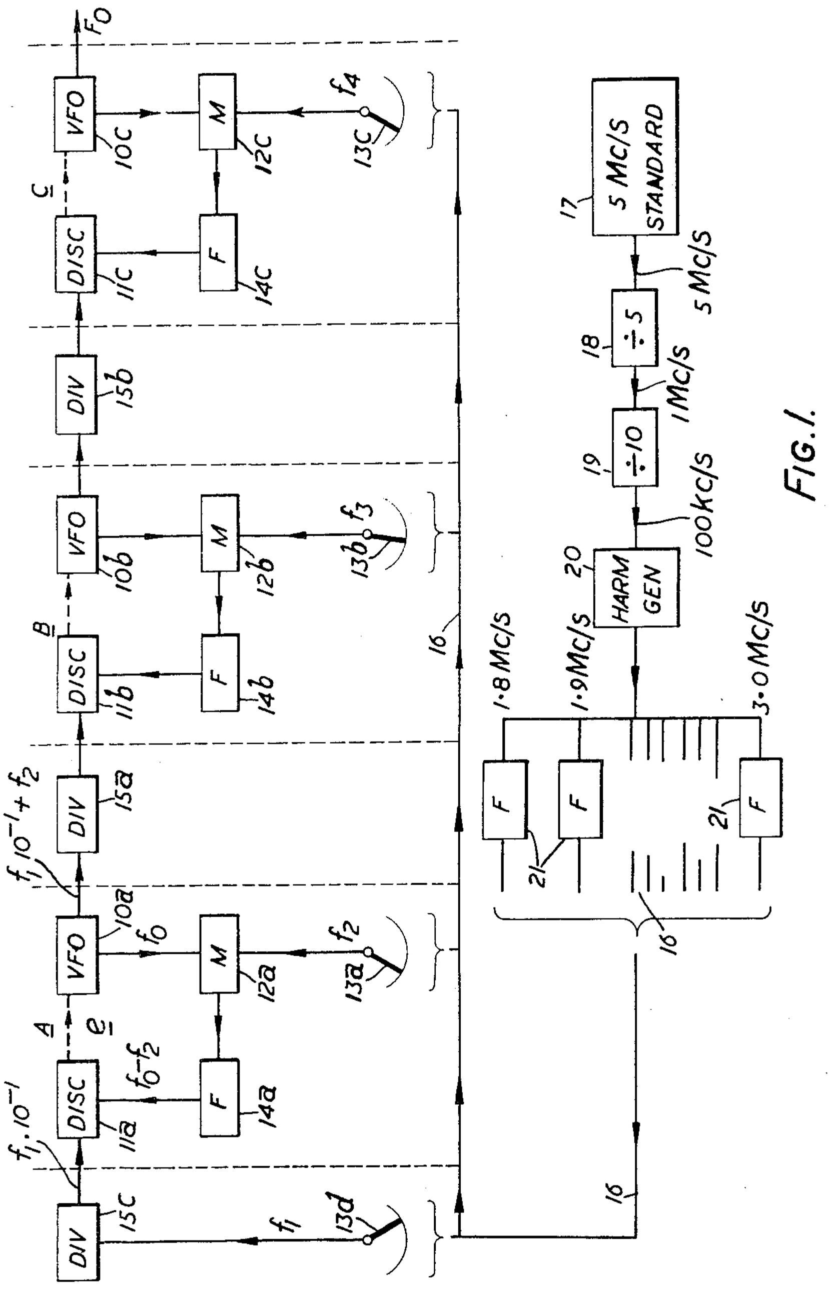
Figure 2:
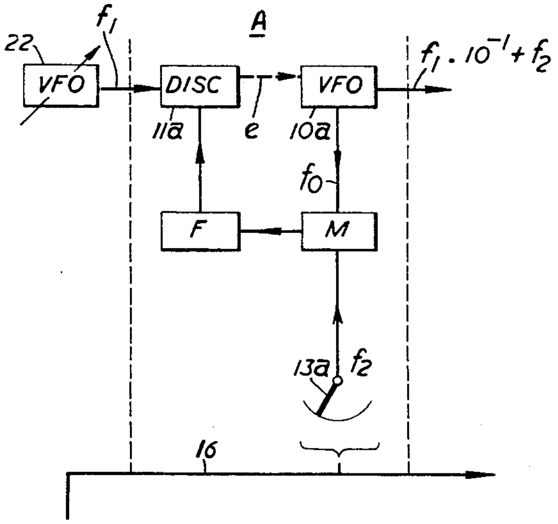

The arrangement shown in FIGURE 1 is a three-stage "frequency synthesiser" capable of generating any frequency in the range 2 mc./s. to 3 mc./s. in 100 c./s. increments. It consists of three identical stages, A, B and C, each including a variable-frequency oscillator 10*a*, 10*b*, 10*c* capable of being tuned over the desired frequency range of 2–3 mc./s. Each oscillator is provided with a frequency control loop including a discriminator or phase comparator 11*a–c* whose output exercises a controlling function in the associated oscillator; the loop is closed through a multiplicative mixer stage 12*a–c* which provides an output which is the difference between the oscillator frequency and a standard frequency chosen by a selector switch 13*a–c*, a bandpass filter 14*a–c* rejecting unwanted products of the mixing process. For each stage a reference frequency is injected at a second input to the discriminator: for stages B and C this reference input is provided by the output of the oscillator 10*a* or 10*b* of the preceding stage, reduced in frequency by a factor of 10 by a digital divider stage 15*a* or 15*b*. The reference input to the first stage A is obtained through a further divider stage 15*c* and a further standard frequency selector switch 14*d*.

The selector switches 13*a–d*, which form the actual frequency-determining controls of the apparatus, are connected to a set of 13 standard-frequency busbars shown diagrammatically at 16. Each switch has ten positions, denoting the digits 0–9 for one digit position of the number representing the required frequency, each switch is connected to a different ten combinations of the busbars 16.

The busbars 16 are supplied from a standard frequency source, such as a crystal-controlled oscillator 17, whose 5 mc./s. output is reduced to 100 kc./s. by dividers 18 and 19 and then used to control the frequency of a harmonic generator 20, such as a multivibrator circuit producing an output waveform whose spectrum includes the harmonics of its 100 kc./s. controlled frequency up to at least 3 mc./s. Harmonics in the range 1.8 mc./s. to 3 mc./s. are selected by filters 21 and passed each to one of the standard frequency busbars 16.

The component circuits shown in FIGURE 1, such as variable-frequency oscillators, mixer stages, frequency discriminators and frequency dividers are all well-known in the art: details of specific examples of suitable circuit arrangements are readily available and need not therefore be included in this specification.

The operation of the circuit can be most readily comprehended by a consideration of its operation for any given setting of the frequency-controlling selector switches 13*a–d*.

Consider the first selector switch 13*d* of the generator set to select a frequency $f_1$ from the range of standard frequencies carried by busbars 16. This frequency is reduced by one order of magnitude by divider 15*c* and fed as $f_1 \cdot 10^{-1}$ to one input of the first stage discriminator 11*a*.

The selector 13*a* of stage A is set to $f_2$. If the frequency of oscillator 10*a* is $f_0$, the output of the mixer 12*a* will include a difference component $f_0 - f_2$ that is selectively passed by filter 14*a*, in preference to the unwanted signal components produced by the mixer 12*a*, this difference frequency being applied to the second input of discriminator 11*a*. The error output *e* of discriminator 11*a* controls the frequency of oscillator 10*a* in such a way as to reduce *e* to zero, a condition obtained when the two inputs to the discriminator are in frequency and phase synchronism. It follows that in this condition the oscillator frequency $f_0$ is given by $$f_0 = f_1 \cdot 10^{-1} + f_2$$

the control loop maintaining this value to accuracy dependent upon the accuracy of the main standard 17. Thus the action of the control loop has locked oscillator 10*a* at a frequency equal to the sum of the stage input frequency and the selected standard frequency. This process is repeated in stages B and C, the stage input frequency being lowered by an order of magnitude by dividers 15*a* and 15*b* before being used as a frequency reference.

Thus the input to the discriminator 11*b* of stage B is $(f_1 \cdot 10^{-1} + f_2)10^{-1}$. If the stage B selector switch 13*b* is set to $f_3$, oscillator 10*b* is locked on to a frequency of $(f_1 \cdot 10^{-1} + f_2)10^{-1} + f_3$. Continuing the process, if selector switch 13*c* of stage C is set to $f_4$, its oscillator 10*c* is locked on to $$F_0 = f_4 + f_3 \cdot 10^{-1} + f_2 \cdot 10^{-2} + f_1 \cdot 10^{-3}$$

In the generator shown, this determines the final output frequency: the principle can however be extended to as many stages as desired.

Each of the frequencies $f_1$–$f_4$ can be any harmonic of 100 kc./s. in the range 1.8 mc./s.–3 mc./s. The output frequency $F_0$ can therefore have any value that is a multiple of 100 c./s., in the desired range of 2–3 mc./s.

It would appear from the foregoing that a series of standard frequencies consisting of the multiples 0–9 of a standard interval such as 100 kc./s. would offer the most desirable basis for a frequency synthesis. However, in order to obtain a frequency range covering 2–3 mc./s. with the minimum number of synthesiser stages, it is more convenient to enable the standard frequencies available to cover the desired range directly. Interpolation between the standard frequencies is then less straightforward mathematically but involves, as extra apparatus, only the filters 21 and busbars 16 necessary to accommodate the thirteen standard frequencies provided. The selector switches 13*a–d* are still ten position switches on which the desired frequency can be set up directly, switch 13*d* being connected with busbars carrying the ten frequencies in the range 2.1 mc./s. to 3.0 mc./s. (corresponding directly with the desired digit) and switches 13*a–c* with the ten frequencies in the range 1.8 mc./s. to 2.7 mc./s.

For a numerical example, consider the generation by the arrangement of FIGURE 1 of a frequency of 2.7314 mc./s. This value can be rendered in terms of the available standards frequencies as $$(2.5+2.1\times10^{-1}+1.9\times10^{-2}+2.4\times10^{-3})\text{ mc./s.}$$

The setting-up procedure is therefore as follows:

(a) The least significant digit, i.e., the one which determines the 100 c./s. increment, is 4; therefore, set the selector switch 13*d* to 2.4 mc./s. (position "4"). In the divider, this is divided by ten and will appear as a reference input to the phase comparator as 240 kc./s.

(b) Set variable oscillator 10*a* to approximately 2.14 mc./s. and selector switch 13*a* to 1.9 mc./s. (position "1"). The resulting difference frequency after the mixer will be approximately 240 kc./s., which, when compared in the phase comparator with the reference 240 kc./s. will phase-lock the variable oscillator 10*a* to exactly 2.14 mc./s. This, when divided by ten will appear as 214 kc./s. at the next phase comparator input.

(c) Set variable oscillator 10*b* to approximately 2.314 mc./s. and selector switch $D_2$ to 2.1 mc./s. (position "3"), resulting in a difference frequency of approximately 2.4 kc./s. When phase-lock occurs, the variable oscillator 10*b* will be producing exactly 2.314 mc./s. This, on division by ten, becomes 231.4 kc./s.

(d) Set variable oscillator 13*c* to approximately 2.7314 mc./s. and selector switch $D_1$ to 2.5 mc./s. (position "7"). The difference is approximately 231.4 kc./s., which locks itself to the incoming frequency of 231.4 kc./s., thus making the output exactly 2.7314 mc./s. This is the required synthesised output.

In the preceding section reference has been made to the approximate setting of the oscillators 10*a–c* during setting-up. This may be effected by the operation of setting the corresponding switches 13*a–c* and reduces the "catching range" required of the discriminators 11*a–c*.

FIGURE 2 shows a detail of a modified arrangement in which the available output frequency is continuously variable over the desired range, as opposed to the 100 c./s. steps afforded by the arrangement of FIGURE 1. This is effected by supplying the discriminator input to stage A from a further variable-frequency oscillator, identical with oscillators 10*a–c* but capable of being manually set to any desired frequency within its 2–3 mc./s. tuning range.

Certain prior suggestions for frequency synthesised arrangements have relied on the provision of a plurality of oscillators each covering a different frequency band corresponding to a digit or digits of the desired frequency. For accurate setting some at least of the stages of these suggested arrangements had to work at low radio frequencies, involving bulky components. By contrast the arrangements shown in the drawings are built up around a single "stage module," associated with simple ancillary circuits, and the lowest signal frequency involved is only one order of magnitude lower than the lowest desired output frequency.

What I claim is:

1. An electrical oscillation generator including a plurality of identical stages each consisting of a variable-frequency oscillator, a mixer device and a frequency discriminator device; a source for a series of standard frequencies any one of which can be selected for feeding to the mixer device of any stage; the stages being arranged in a predetermined sequence whereby a first input to the discriminator device of each stage except the first stage is obtained through one of a series of identical frequency dividers from the variable-frequency oscillator of the next preceding stage in the sequence, a second input to the discriminator consisting of the difference frequency resulting from the comparison in the mixer device of the stage of the selected one of the said standard frequencies with the frequency of the variable-frequency oscillator of the stage, which is arranged to be controlled in accordance with an output of the discriminator device in such a way as to reduce to zero the difference in frequency between the said two inputs to the discriminator.

2. An oscillation generator according to claim 1, wherein the said first input to the discriminator device of the first stage consists of a selected one of the series of standard frequencies applied through a fixed-ratio frequency divider.

3. An oscillation generator according to claim 1, wherein the said first input to the discriminator device of the first stage is obtained from a free-running oscillator of continuously-variable frequency.

References Cited by the Examiner

UNITED STATES PATENTS 2,786,140 3/57 Lewis ---------------- 331—2

ROY LAKE, *Primary Examiner.*